(12) United States Patent
Yu et al.

(10) Patent No.: US 11,983,340 B2
(45) Date of Patent: May 14, 2024

(54) DISPLAY SUBSTRATE, METHOD FOR MANUFACTURING SAME, AND DISPLAY DEVICE

(71) Applicants: Chengdu BOE Optoelectronics Technology Co., Ltd., Sichuan (CN); BOE Technology Group Co., Ltd., Beijing (CN)

(72) Inventors: Zhaowei Yu, Beijing (CN); Qinhe Wei, Beijing (CN); Rongjian Yan, Beijing (CN); Wenbin Chen, Beijing (CN)

(73) Assignees: Chengdu BOE Optoelectronics Technology Co., Ltd., Sichuan (CN); BOE Technology Group Co., Ltd., Beijing (CN)

(*) Notice: Subject to any disclaimer, the term of this patent is extended or adjusted under 35 U.S.C. 154(b) by 239 days.

(21) Appl. No.: 17/486,827

(22) Filed: Sep. 27, 2021

(65) Prior Publication Data
US 2022/0100304 A1   Mar. 31, 2022

(30) Foreign Application Priority Data
Sep. 30, 2020   (CN) .......................... 202011063528.5

(51) Int. Cl.
| H10K 50/84 | (2023.01) |
| G06F 3/041 | (2006.01) |
| H10K 59/122 | (2023.01) |
| H10K 59/124 | (2023.01) |
| H10K 59/40 | (2023.01) |
| H10K 71/00 | (2023.01) |
| H10K 77/10 | (2023.01) |

(52) U.S. Cl.
CPC ............ *G06F 3/0412* (2013.01); *H10K 50/84* (2023.02); *H10K 59/122* (2023.02); *H10K 59/124* (2023.02); *H10K 59/40* (2023.02); *H10K 71/00* (2023.02); *H10K 77/111* (2023.02)

(58) Field of Classification Search
CPC .... G06F 3/0412; G06F 3/0443; G06F 3/0446; H10K 50/84; H10K 59/122; H10K 59/124; H10K 59/40; H10K 71/00; H10K 77/111; H10K 2102/311; H10K 50/844; H10K 59/1201; Y02E 10/549
See application file for complete search history.

(56) References Cited

U.S. PATENT DOCUMENTS

2017/0213873 A1* 7/2017 Bok ................. H10K 59/121
2022/0261117 A1   8/2022 Cui et al.

FOREIGN PATENT DOCUMENTS

| CN | 110993672 A | 4/2020 |
| CN | 111580698 A | 8/2020 |

OTHER PUBLICATIONS

CN202011063528.5 first office action.

* cited by examiner

*Primary Examiner* — Kyoung Lee
(74) *Attorney, Agent, or Firm* — IPro, PLLC (57) ABSTRACT

A display substrate is provided. The display substrate includes: a base substrate; a pixel defining layer disposed on the base substrate, wherein the pixel defining layer defines a plurality of sub-pixel areas and has a groove therein; and a touch structure disposed in the groove, wherein the touch structure is configured to provide a touch function.

17 Claims, 4 Drawing Sheets

DISPLAY SUBSTRATE, METHOD FOR MANUFACTURING SAME, AND DISPLAY DEVICE

CROSS-REFERENCE TO RELATED APPLICATION

This application claims priority to Chinese Patent Application No. 202011063528.5, filed on Sep. 30, 2020 and entitled "FLEXIBLE DISPLAY SUBSTRATE, METHOD FOR MANUFACTURING SAME, AND DISPLAY DEVICE", which is incorporated herein by reference in its entirety.

TECHNICAL FIELD

The present disclosure relates to a display substrate, a method for manufacturing the same, and a display device.

BACKGROUND

Flexible multiple layer on cell (FMLOC) is a technology for integrating a touch structure in a flexible display substrate. However, integrating the touch structure in the flexible display substrate easily increases the thickness of the flexible display substrate.

SUMMARY

The present disclosure provides a display substrate, a method for manufacturing the same, and a display device.

In a first aspect, a display substrate is provided. The display substrate includes: a base substrate; a pixel defining layer (PDL) disposed on the base substrate, wherein the pixel defining layer defines a plurality of sub-pixel areas and has a groove therein; and a touch structure disposed in the groove, wherein the touch structure is configured to provide a touch function.

Optionally, the touch structure includes a plurality of touch electrodes, wherein each of the touch electrodes corresponds to at least one sub-pixel area, and an area corresponding to the sub-pixel area of the touch electrode is a light-transmitting area.

Optionally, the area corresponding to the sub-pixel area of the touch electrode has an opening.

Optionally, an orthographic projection of the touch electrode on the base substrate is in the shape of a ring, and an orthographic projection of the sub-pixel area corresponding to the touch electrode on the base substrate is within the ring.

Optionally, the touch electrode is in the shape of a ring.

Optionally, an inner ring and an outer ring of the ring are both rectangular.

Optionally, the touch structure includes a plurality of emitting electrode groups and a plurality of receiving electrode groups, wherein the plurality of receiving electrode groups is arranged in an array along a first direction, and the plurality of emitting electrode groups is arranged in an array along a second direction, wherein the emitting electrode group includes a plurality of emitting electrodes and a first connecting line connecting the plurality of emitting electrodes, the plurality of emitting electrodes being arranged in an array along the first direction; and the receiving electrode group includes a plurality of receiving electrodes and a second connecting line connecting the plurality of receiving electrodes, the plurality of receiving electrodes being arranged in an array along the second direction, wherein the emitting electrode and the receiving electrode are both touch electrodes; the first connecting line and the second connecting line intersect; and an orthographic projection of the emitting electrode on the base substrate is not overlapped with an orthographic projection of the receiving electrode on the base substrate.

Optionally, the pixel defining layer has a plurality of grooves, and the emitting electrode and the receiving electrode are disposed in different grooves.

Optionally, the display substrate further includes: an insulating dielectric layer, disposed between the first connecting line and the second connecting line.

Optionally, at least a portion of the insulating dielectric layer is disposed in the groove in which the touch electrode is disposed.

Optionally, an opening of the groove is on a side of the pixel defining layer distal from the base substrate.

Optionally, a depth of the groove is greater than or equal to a maximum thickness of the touch structure, wherein the depth is a dimension of the groove in a direction perpendicular to the base substrate, and a thickness of the touch structure is a dimension of the touch structure in the direction perpendicular to the base substrate.

Optionally, an opening of the groove has a width of 15 to 30 μm.

Optionally, the display substrate further includes: a light-emitting unit, disposed in the sub-pixel area; and an encapsulating structure, disposed on a side of the light-emitting unit distal from the base substrate, wherein the encapsulating structure includes a first inorganic sub-layer, an organic sub-layer and a second inorganic sub-layer laminated in a direction going away from the base substrate, and the touch structure is disposed between the first inorganic sub-layer and the organic sub-layer.

Optionally, at least a portion of the first inorganic sub-layer is in contact with at least a portion of the organic sub-layer.

Optionally, the display substrate further includes: a back plate circuit layer, disposed between the pixel defining layer and the base substrate.

Optionally, the display substrate is a flexible display substrate.

Optionally, the display substrate is a flexible display substrate; the touch structure includes a plurality of touch electrodes, wherein the touch electrode is in the shape of a ring; an orthographic projection of the touch electrode on the base substrate is in the shape of a ring, an inner ring and an outer ring of the ring being both rectangular; and the touch electrode corresponds to at least one sub-pixel area, an orthographic projection of the sub-pixel area corresponding to the touch electrode on the base substrate being within the ring; the touch structure includes a plurality of emitting electrode groups and a plurality of receiving electrode groups, the plurality of receiving electrode groups being arranged in an array along a first direction and the plurality of emitting electrode groups being arranged in an array along a second direction, wherein the emitting electrode group includes a plurality of emitting electrodes and a first connecting line connecting the plurality of emitting electrodes, the plurality of emitting electrodes being arranged in an array along the first direction; and the receiving electrode group includes a plurality of receiving electrodes and a second connecting line connecting the plurality of receiving electrodes, the plurality of receiving electrodes being arranged in an array along the second direction, wherein the emitting electrode and the receiving electrode are both touch electrodes; the first connecting line and the second connecting line intersect; and the emitting electrode and the receiving electrode are disposed in different grooves, an opening of the groove is on a side of the pixel defining layer distal from the base substrate, a depth of the groove is greater than or equal to a maximum thickness of the touch structure, wherein the depth is a dimension of the groove in a direction perpendicular to the base substrate, and a thickness of the touch structure is a dimension of the touch structure in the direction perpendicular to the base substrate; and the opening of the groove has a width of 15 to 30 μm; the display substrate further includes: an insulating dielectric layer, disposed between the first connecting line and the second connecting line, wherein at least a portion of the insulating dielectric layer is disposed in the groove in which the touch electrode is disposed; a light-emitting unit, disposed in the sub-pixel area; an encapsulating structure, disposed on a side of the light-emitting unit distal from the base substrate, wherein the encapsulating structure includes a first inorganic sub-layer, an organic sub-layer and a second inorganic sub-layer laminated in a direction going away from the base substrate, the touch structure is disposed between the first inorganic sub-layer and the organic sub-layer, and at least a portion of the first inorganic sub-layer is in contact with at least a portion of the organic sub-layer; and a back plate circuit layer, disposed between the pixel defining layer and the base substrate.

In a second aspect, a method for manufacturing a display substrate is provided. The method includes: forming a pixel defining layer on a base substrate, wherein the pixel defining layer defines a plurality of sub-pixel areas; forming a groove in the pixel defining layer; and forming a touch structure in the groove, wherein the touch structure is configured to provide a touch function.

Optionally, the touch structure includes a plurality of emitting electrode groups and a plurality of receiving electrode groups, wherein the emitting electrode group includes a plurality of emitting electrodes and a first connecting line connecting the plurality of emitting electrodes, and the receiving electrode group includes a plurality of receiving electrodes and a second connecting line connecting the plurality of receiving electrodes; and the method further includes: forming an insulating dielectric layer, wherein the insulating dielectric layer is disposed between the first connecting line and the second connecting line.

Optionally, the method further includes: forming a light-emitting unit, wherein the light-emitting unit is disposed in the sub-pixel area and forming an encapsulating structure, wherein the encapsulating structure is disposed on a side of the light-emitting unit distal from the base substrate and includes a first inorganic sub-layer, an organic sub-layer and a second inorganic sub-layer laminated in a direction going away from the base substrate, the touch structure is disposed between the first inorganic sub-layer and the organic sub-layer, and at least a portion of the first inorganic sub-layer is in contact with at least a portion of the organic sub-layer.

In a third aspect, a display device is provided. The display device includes a display substrate as defined in the first aspect or in any optional implementation of the first aspect

DETAILED DESCRIPTION

Embodiments of the present disclosure will be described below. The embodiments described below are exemplary and merely intended to explain the present disclosure, and shall not be understood as a limitation to the present disclosure.

Organic light-emitting diodes (OLED) have advantages of self-illumination, high brightness, fast response, and wide color gamut and can be used to manufacture a flexible display device. Thus, OLED display technology is considered as an ideal next-generation display technology to replace the liquid crystal display technology. The display products are gradually developed in a thinner and lighter trend. In order to follow the latest development trend of products, the current mainstream is to combine the touch structure and the display back plate by an FMLOC technology. By replacing the form of external structures, the FMLOC can facilitate the thinness and lightness of the display products.

For example, the thinness and lightness of the display products may be achieved by integrating the touch structure in the flexible display substrate by the FMLOC technology. The flexible display substrate typically includes a flexible display back plate, a light-emitting structure on the flexible display back plate, and an encapsulating structure on a side of the light-emitting structure distal from the flexible display back plate. Currently, the touch structure is generally integrated into the encapsulating structure (i.e., the touch structure is disposed on a side of the encapsulating structure distal from the flexible display back plate), which easily increases the thickness of the flexible display substrate, and is not conducive to the thinness and lightness of the display products. In addition, the yield of the flexible display substrate may be affected due to the great thickness. For example, the film layer bonding stress is typically manifested as film layer separation, film layer rupture and the like when the tension stress is applied. When the thickness of the flexible display substrate increases, the flexible display substrate is deformed more significantly when 3D attachment is performed on the flexible display substrate, which may result in the film layer separation and film layer rupture caused by the excessive internal stress concentration in the flexible display substrate. For example, when the flexible display substrate is bent with large curvature, the encapsulating structure in the flexible display substrate is prone to film layer separation, which may cause the encapsulation to fail and result in the growing dark spots (GDS) phenomenon, thereby affecting the display effect. Therefore, there is an urgent need for a flexible display substrate, a manufacturing method for the same, and a display device including the flexible display substrate to solve the aforesaid technical problems.

The present disclosure provides a display substrate, a method for manufacturing the same, and a display device, which can help reduce the thickness of the display substrate, and realize the thinness and lightness of the display substrate, thereby solving the aforesaid problems in the current FMLOC technology. For example, the display substrate is a flexible display substrate, and the technical solutions in the present disclosure can solve the problem of encapsulation failure during bending which is caused by the increased thickness of the flexible display substrate.

The technical solutions of the present disclosure are described below in conjunction with the accompanying drawings.

Figure 1:
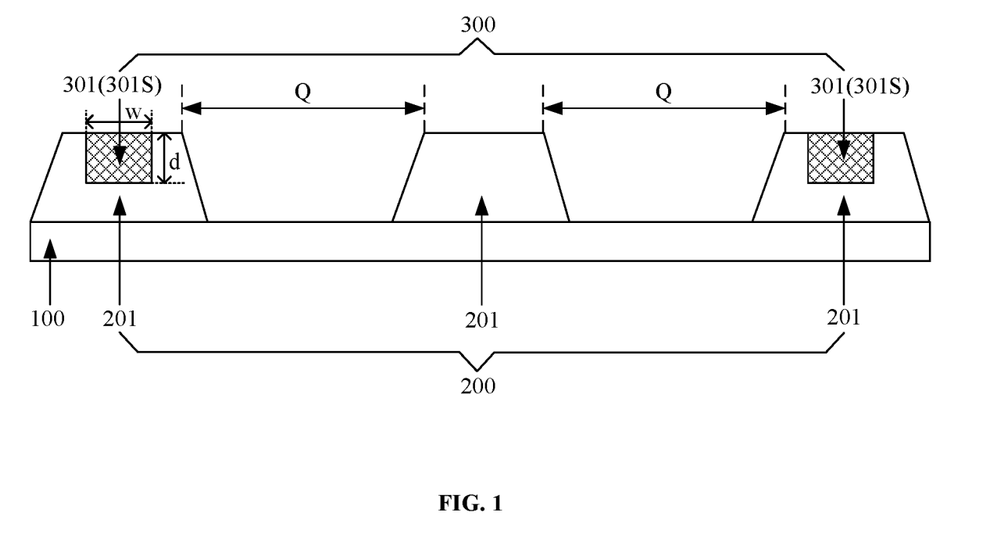
FIG. 1 is a cross-sectional view of a display substrate according to an embodiment of the present disclosure.

Please refer to FIG. 1, which is a cross-sectional view of a display substrate according to an embodiment of the present disclosure. The display substrate includes a base substrate 100, a pixel defining layer 200, and a touch structure 300. The pixel defining layer 200 is disposed on the base substrate 100, and defines a plurality of sub-pixel areas Q. The pixel defining layer 200 has a groove (not shown in FIG. 1). The touch structure 300 is disposed in the groove of the pixel defining layer 200, and configured to provide a touch function. The sub-pixel areas Q are configured to be provided with sub-pixels.

In summary, the embodiment of the present disclosure provides a display substrate. The pixel defining layer in the display substrate has a groove in which the touch structure for providing the touch function is disposed. Therefore, the thickness of the display substrate may be reduced and the thinness and lightness of the display substrate are facilitated.

As shown in FIG. 1, the opening of the groove is disposed on a side of the pixel defining layer 200 distal from the base substrate 100. The depth d of the groove is greater than or equal to the maximum thickness of the touch structure 300, and FIG. 1 is illustrated by taking the groove with a depth d equal to the maximum thickness of the touch structure 300 as an example. The depth d of the groove is the dimension of the groove in the direction perpendicular to the base substrate 100, and the thickness of the touch structure 300 is the dimension of the touch structure 300 in the direction perpendicular to the base substrate 100. The touch structure 300 may have different thicknesses at different portions, and the maximum thickness of the touch structure 300 is the maximum value among the thicknesses at different portions of the touch structure 300. Since the depth d of the groove is greater than or equal to the maximum thickness of the touch structure 300, the touch structure 300 does not protrude from the side of the pixel defining layer 200 distal from the base substrate 100. Therefore, the thickness of the display substrate is not increased when the touch structure 300 is provided in the groove of the pixel defining layer 200.

As shown in FIG. 1, the pixel defining layer 200 includes a plurality of barriers 201, and some or all of the barriers 201 has a groove. FIG. 1 is illustrated by taking an example in which some of the barriers 201 of the pixel defining layer 200 has a groove. A first cross section of the barrier 201 is trapezoidal, and the width w of the opening of the groove is less than or equal to the width of the top edge of the trapezoid. FIG. 1 is illustrated by taking an example in which the width w of the opening of the groove is less than the width of the top edge of the trapezoid. The first cross section of the barrier 201 is perpendicular to the substrate surface of the base substrate 100 and perpendicular to the length direction of the barrier 201. The width w of the opening of the groove is 15 to 30 µm. For example, the width w of the opening of the groove is 20 µm, 25 µm, and so on. If the width w of the opening of the groove is too large, the width of the barrier 201 shall also be large. However, a too large width of the barrier 201 may easily result in small pixel openings and a short service life and the like in the display substrate. If the width of the groove is too small, the width of the barrier 201 shall also be small. However, a too small width of the barrier 201 may easily result in a sub-pixel crosstalk problem in the display substrate. In the embodiment of the present disclosure, the width w of the opening of the groove is set to be 15 to 30 µm, which can avoid the sub-pixel crosstalk problem in the display substrate and ensure the pixel opening and service life of the display substrate.

As shown in FIG. 1, the touch structure 300 includes a plurality of touch electrodes 301, the pixel defining layer 200 has a plurality of grooves, and each touch electrode 301 is disposed in one groove in the pixel defining layer 200. Each touch electrode 301 may correspond to at least one sub-pixel area Q, and the area corresponding to the sub-pixel area Q of each touch electrode 301 is a light-transmitting area. For example, the area corresponding to the sub-pixel area Q of each touch electrode 301 has an opening, such that the area corresponding to the sub-pixel area Q of the touch electrode 301 is a light-transmitting area. The area corresponding to the sub-pixel area Q of the touch electrode 301 is a light-transmitting area, which can prevent the touch electrode 301 from shielding the sub-pixels in the sub-pixel area Q and ensure the light outputting ratio of the display substrate.

Optionally, the orthographic projection of each touch electrode 301 on the base substrate 100 is in the shape of a ring, and the orthographic projection of the sub-pixel area Q corresponding to each touch electrode 301 on the base substrate is within the ring. For example, each touch electrode 301 is in the shape of a ring. The inner ring and the outer ring of each touch electrode 301 are both rectangular in shape, and each touch electrode 301 extends around the four sub-pixel areas Q corresponding to the touch electrode 301. When the touch electrode 301 is in the ring shape, the groove in which the touch electrode 301 is disposed is also in the ring.

Figure 2:
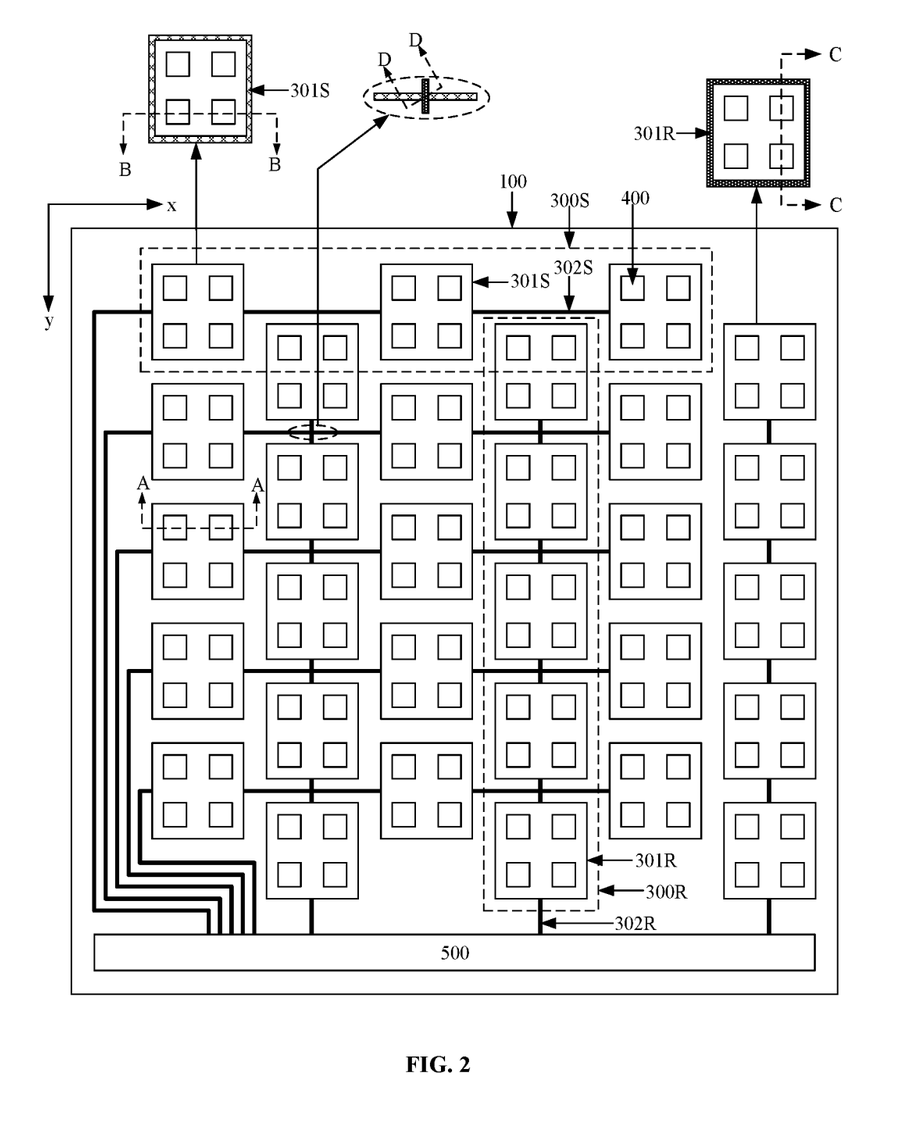
FIG. 2 is a front view of a display substrate according to an embodiment of the present disclosure.

Please refer to FIG. 2, which is a front view of a display substrate according to an embodiment of the present disclosure. As shown in FIG. 1 and FIG. 2, the touch electrode 301 in the display substrate includes an emitting electrode 301S and a receiving electrode 301R. One sub-pixel 400 is in each sub-pixel area Q (not marked in FIG. 2), and each touch electrode 301 corresponds to four sub-pixels 400 (that is, each touch electrode 301 corresponds to four sub-pixel areas Q). Each touch electrode 301 is in a ring shape. The inner ring and the outer ring of each touch electrode 301 are both rectangular in shape, and each touch electrode 301 extends around the four sub-pixels 400 corresponding to the touch electrode 301. Each touch electrode 301 is disposed in one groove of the pixel defining layer 200, and the structure of the groove in which each touch electrode 301 is disposed matches the structure of the touch electrode 301. FIG. 1 may be a cross-sectional view of the portion A-A in FIG. 2, and the sub-pixel 400 is not shown in FIG. 1.

As shown in FIG. 2, the touch structure 300 includes a plurality of emitting electrode groups 300S and a plurality of receiving electrode groups 300R. The plurality of receiving electrode groups 300R is arranged in an array along the first direction x, and the plurality of emitting electrode groups 300S is arranged in an array along the second direction y. Each emitting electrode group 300S includes a plurality of emitting electrodes 301S and a first connecting line 302S connecting the plurality of emitting electrodes 301S, and the plurality of emitting electrodes 301S is arranged in an array along the first direction x. Each receiving electrode group 300R includes a plurality of receiving electrodes 301R and a second connecting line 302R connecting the plurality of receiving electrodes 301R, and the plurality of receiving electrodes 301R is arranged in an array along the second direction y. The first connecting line 302S and the second connecting line 302R intersect, and the orthographic projection of the emitting electrode 301S on the base substrate 100 is not overlapped with the orthographic projection of the receiving electrode 301R on the base substrate 100. For example, the emitting electrode 301S and the receiving electrode 301R are disposed in different grooves. The emitting electrode 301S and the receiving electrode 301R are both touch electrodes. The pixel defining layer 200 further has grooves for accommodating the first connecting line 302S and the second connecting line 302R. The first connecting line 302S and the second connecting line 302R are also disposed in the grooves of the pixel defining layer 200, to avoid an increase in thickness of the display substrate caused by the first connecting line 302S and the second connecting line 302R.

As shown in FIG. 2, the first connecting line 302S in each emitting electrode group 300S further connects the emitting electrode group 300S to a touch integrated circuit (IC) 500, and the second connecting line 302R in each receiving electrode group 300R further connects the receiving electrode group 300R to the touch IC 500. The emitting electrode group 300S is configured to receive touch signals in the first direction x, and the receiving electrode group 300R is configured to receive touch signals in the second direction y. When a touch event occurs, the emitting electrode group 300S and the receiving electrode group 300R transmit the touch signals in the first direction and the touch signals in the second direction to the touch IC 500, respectively. The touch IC 500 determines the location where the touch event occurs based on the touch signals as received, thereby triggering the corresponding event.

As shown in FIG. 2, any two emitting electrode groups 300S of the plurality of emitting electrode groups 300S are disposed in parallel, and each emitting electrode group 300S extends along the first direction x. The distance between adjacent emitting electrode groups 300S may be set based on requirements in use. Any two receiving electrode groups 300R of the plurality of receiving electrode groups 300R are disposed in parallel, and each receiving electrode group 300R extends along the second direction y. The distance between adjacent receiving electrode groups 300R may be set based on requirements in use.

FIG. 2 shows merely an example, and does not limit the technical solutions of the present disclosure. In an actual display substrate, the number of emitting electrode groups, the number of receiving electrode groups, the number of emitting electrodes in the emitting electrode group, and the number of receiving electrodes in the receiving electrode group may all be flexibly set based on actual needs. The number of the sub-pixels to which the touch electrode corresponds may be flexibly set. For example, the touch electrode may correspond to 1, 2, 3, 4 or more sub-pixels. In addition, the embodiment of the present disclosure is illustrated by taking the touch electrode (including the emitting electrode and the receiving electrode) in a ring shape as an example, which merely shows one shape of the touch electrode and shall not be understood as a limitation to the structure of the touch electrode. Those skilled in the art may flexibly set the structure of the touch electrode based on needs. For example, the touch electrode may also be rhombic or triangular in shape, or may be an interdigital electrode. Regardless of the structure of the touch electrode, the area corresponding to the sub-pixel in the touch electrode is a light-transmitting area, to ensure the light outputting rate of the display substrate. The light-transmitting area may be realized by providing openings, or by adopting light-transmitting materials. For example, each touch electrode is configured to correspond to a plurality of sub-pixels, and an opening is provided in the area corresponding to each of the sub-pixels, such that the touch electrode may be a hollow electrode. That is, the touch electrode has hollows therein. In the embodiments of the present disclosure, the angle between the first direction x and the second direction y may be set based on the shape of the touch electrode and the requirement on the touch function. For example, the angle between the first direction x and the second direction y may be 90°, that is, the first direction x is perpendicular to the second direction y.

Figure 3:
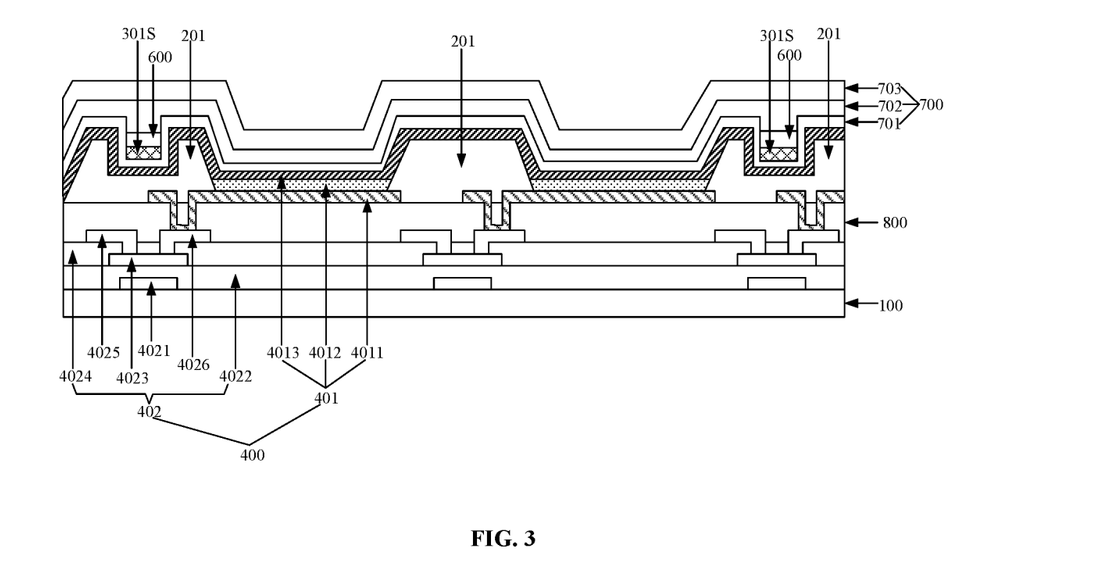
FIG. 3 is a cross-sectional view of a portion B-B of the display substrate shown in FIG. 2.
Figure 4:
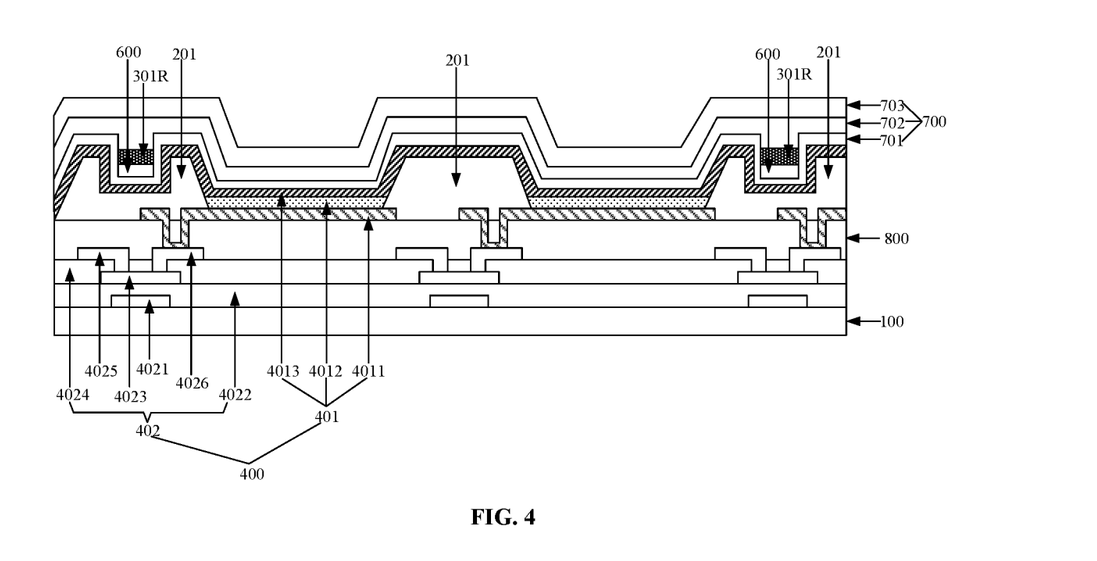
FIG. 4 is a cross-sectional view of a portion C-C of the display substrate shown in FIG. 2.
Figure 5:
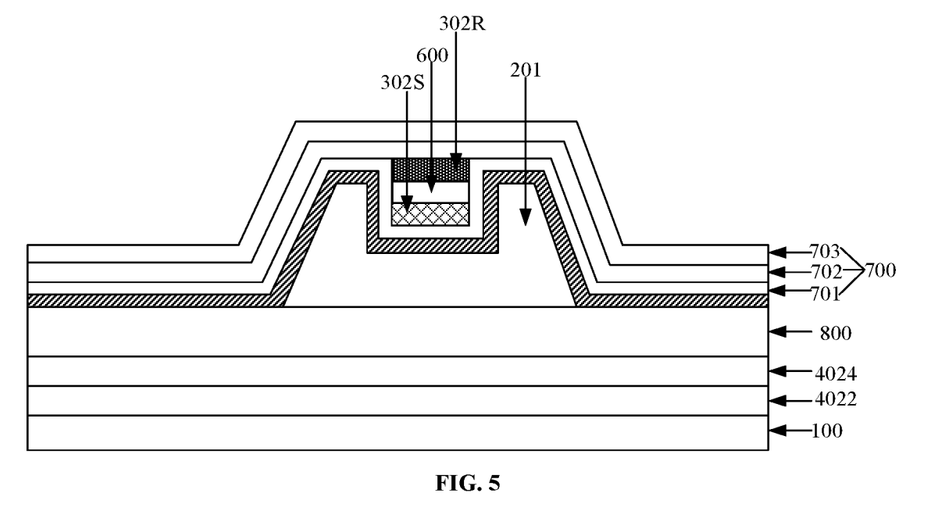
FIG. 5 is a cross-sectional view of a portion D of the display substrate shown in FIG. 2.

In the embodiments of the present disclosure, the first connecting line 302S may be disposed in a same layer with the emitting electrode 301S, and the first connecting line 302S may be disposed in the groove of the pixel defining layer 200. The second connecting line 302R may be disposed in a same layer with the receiving electrode 301R, and the second connecting line 302R may be disposed in the groove of the pixel defining layer 200. The first connecting line 302S and the second connecting line 302R are insulated from each other. In an optional embodiment, reference is made to FIG. 3 to FIG. 5. FIG. 3 is a cross-sectional view of the portion B-B of the display substrate shown in FIG. 2, FIG. 4 is a cross-sectional view of the portion C-C of the display substrate shown in FIG. 2, and FIG. 5 is a cross-sectional view of the portion D-D of the display substrate shown in FIG. 2. FIG. 3 to FIG. 5 are illustrated by taking an example in which the first connecting line 302S and the emitting electrode 301S are disposed in the same layer, and the second connecting line 302R and the receiving electrode 301R are disposed in the same layer. As shown in FIG. 3 to FIG. 5, the display substrate further includes an insulating dielectric layer 600. The insulating dielectric layer 600 is disposed between the first connecting line 302S and the second connecting line 302R and the insulating dielectric layer 600 is configured to isolate the first connecting line 302S from the second connecting line 302R, such that the first connecting line 302S and the second connecting line 302R are insulated from each other. As shown in FIG. 3 and FIG. 4, an insulating dielectric layer 600 is provided in the groove where each touch electrode 301 is disposed. That is, the insulating dielectric layer 600 is provided in both the groove where the emitting electrode 301S is disposed and the groove where the receiving electrode 301R is disposed. The emitting electrode 301S and the first connecting line 302S are both disposed on a side of the insulating dielectric layer 600 proximate to the base substrate 100, and the receiving electrode 301R and the second connecting line 302R are both disposed on a side of the insulating dielectric layer 600 distal from the base substrate 100. In this way, the capacity of the display substrate in reducing the stress concentration can be improved, and a short circuit can be prevented from occurring at the connecting line. For example, when the touch event occurs, the distance between the first connecting line 302S and the second connecting line 302R decreases, to cause the capacitance value between the first connecting line 302S and the second connecting line 302R to change, such that touch signals are generated. Then, the touch signals are received by the emitting electrode group 300S and the receiving electrode group 300R, to be finally transmitted to the touch IC 500.

FIG. 3 to FIG. 5 are illustrated by taking an example in which the insulating dielectric layer 600 is distributed in the grooves where the touch electrode 301 (including the emitting electrode 301S and the receiving electrode 301R) and the connecting line 302 (including the first connecting line 302S and the second connecting line 302R) are disposed. In some embodiments, the insulating dielectric layer 600 may also be provided outside the groove, to reduce the difficulty in manufacturing the insulating dielectric layer 600. In addition, FIG. 3 to FIG. 5 are illustrated by taking an example in which no groove is provided in the pixel defining layer 200 in the area enclosed by the touch electrode 301 (e.g., in FIG. 3 and FIG. 4, no groove is provided in the barrier 201 in the middle). In some embodiments, the groove may also be provided in the pixel defining layer 200 in the area enclosed by the touch electrode 301, and the insulating dielectric layer 600 may be provided or may not be provided in the groove, which is not limited in the embodiments of the present disclosure.

In the embodiments of the present disclosure, the portions B-B, C-C, and D-D are representative portions of the display substrate. The present disclosure shows cross-sectional views of these representative portions, and the cross-sectional views of other portions may be made reference to FIG. 3 to FIG. 5. For example, FIG. 5 shows a cross-sectional view of the intersection portion between the first connecting line 302S and the second connecting line 302R. The groove where a portion of the first connecting line 302S which does not intersect with the second connecting line 302R is disposed may be provided with the insulating dielectric layer 600 or merely provided with the first connecting line 302S. Similarly, the groove where a portion of the second connecting line 302R which does not intersect with the first connecting line 302S is disposed may be provided with the insulating dielectric layer 600 or merely provided with the second connecting line 302R, which is not limited in the embodiments of the present disclosure.

As described above, the depth of the groove in the pixel defining layer 200 is greater than or equal to the maximum thickness of the touch structure 300. As shown in FIG. 3 to FIG. 5, the maximum thickness of the touch structure 300 is the sum of the thicknesses of the first connecting line 302S, the insulating dielectric layer 600 and the second connecting line 302R. That is, the depth of the groove in the pixel defining layer 200 is greater than or equal to the sum of the thicknesses of the first connecting line 302S, the insulating dielectric layer 600 and the second connecting line 302R. Thus, the thickness of the display substrate can be reduced without affecting the performance of the touch structure 300. Since the emitting electrode 301S, the receiving electrode 301R, the first connecting line 302S, and the second connecting line 302R are all disposed in the grooves in the pixel defining layer 200, the emitting electrode 301S, the receiving electrode 301R, the first connecting line 302S, and the second connecting line 302R may be stuck in the grooves when the display substrate is bent, such that the interaction force between respective layers of the touch structure 300 can be improved, thereby prevent layers of the touch structure 300 from being separated.

The materials of the emitting electrode, the receiving electrode, the first connecting line, the second connecting line, and the insulating dielectric layer are not limited in the present disclosure. The emitting electrode and the first connecting line may be made from the same material, the receiving electrode and the second connecting line may be made from the same material, and the emitting electrode and the receiving electrode may be made from the same or different materials. For example, the material of each of the emitting electrode and the receiving electrode may be at least one of titanium, aluminum, copper, and molybdenum. The material of the insulating dielectric layer may be at least one of silicon nitride and silicon oxynitride.

Please continue referring to FIG. 3 to FIG. 5. The display substrate further includes a back plate circuit layer, a light-emitting unit 401 and an encapsulating structure 700. The back plate circuit layer is disposed between the base substrate 100 and the pixel defining layer 200, and includes a plurality of thin film transistors (TFT) 402. One light-emitting unit 401 is provided in each sub-pixel area Q, and the light-emitting unit 401 in each sub-pixel area Q is connected to one TFT 402, to form a sub-pixel 400. The encapsulating structure 700 is disposed on a side of the light-emitting unit 401 distal from the base substrate 100, and includes a first inorganic sub-layer 701, an organic sub-layer 702, and a second inorganic sub-layer 703 laminated in a direction going away from the base substrate 100. The touch structure 300 is disposed between the first inorganic sub-layer 701 and the organic sub-layer 702, and at least a portion of the first inorganic sub-layer 701 is in contact with at least a portion of the organic sub-layer 702, so as to prevent the encapsulating performance of the encapsulating structure 700 from being affected by the arrangement of the touch structure 300 between the first inorganic sub-layer 701 and the organic sub-layer 702.

In an optional embodiment, the light-emitting unit 401 is an OLED. As shown in FIG. 3 and FIG. 4, the light-emitting unit 401 includes an anode 4011, a light-emitting layer 4012, and a cathode 4013 that are sequentially laminated in a direction going away from the base substrate 100. The anode 4011 is disposed in the sub-pixel area. The cathode 4013 may be a common cathode, and the cathode 4013 covers the sub-pixel area and the pixel defining layer 200 and extends into the groove in the pixel defining layer 200. The first inorganic sub-layer 701 in the encapsulating structure 700 is laminated on the side of the cathode 4013 distal from the base substrate 100 and filled into the groove. In the embodiments of the present disclosure, the touch structure 300 is disposed between the first inorganic sub-layer 701 and the organic sub-layer 702, such that the touch structure 300 can be prevented from directly contacting the cathode 4013 to cause the short circuit. The first inorganic sub-layer 701 in the present disclosure serves as an encapsulating film layer and also a buffer layer. In other words, the thickness of the first inorganic sub-layer 701 in the present disclosure is slightly bigger than the thickness of the first inorganic sub-layer in the traditional encapsulating structure, but may be smaller than the sum of the thicknesses of the first inorganic sub-layer and the buffer layer in the traditional encapsulating structure. By adjusting the position and thickness of the first inorganic sub-layer 701, the encapsulating structure 700 can still achieve a good encapsulating effect without providing a buffer layer, and the thickness of the display substrate can be reduced.

As shown in FIG. 3 and FIG. 4, the TFT 402 includes a gate 4021, a gate insulating layer 4022, an active layer 4023, an interlayer dielectric layer 4024, and a source-drain layer sequentially laminated along a direction going away from the base substrate 100. The source-drain layer includes a source 4025 and a drain 4026 which are electrically connected to the active layer 4023 through via holes in the interlayer dielectric layer 4024. The anode 4011 of the light-emitting unit 402 is electrically connected to the drain 4026 of the TFT 402. As shown in FIG. 3 and FIG. 4, the display substrate further includes a planarization layer 800. The anode 4011 is electrically connected to the drain 4026 through a via hole in the planarization layer 800. FIG. 3 and FIG. 4 are illustrated by taking an example in which the TFT 402 is a bottom-gate TFT. The TFT may also be a top-gate TFT, and the type of the TFT is not limited in the embodiments of the present disclosure.

FIG. 3 to FIG. 5 only exemplarily show the back plate circuit layer, the light-emitting unit 401 and the encapsulating structure 700. The actual structures of the back plate circuit layer, the light-emitting unit 401 and the encapsulating structure 700 are not limited to those shown in FIG. 3 to FIG. 5. For example, the organic sub-layer 702 in the encapsulating structure 700 may be not only in a regular shape, but also in an irregular shape. When the depth of the groove is greater than the thickness of the touch structure 300, the side of the touch structure 300 distal from the base substrate 100 may be filled with the organic sub-layer 702.

The display substrate according to the embodiments of the present disclosure may be a flexible display substrate. By providing the touch structure in the groove of the pixel defining layer, the film layers in the display substrate can be prevented from peeling off during the 3D attachment, thereby solving the problem of poor display. In addition, the display substrate can be lighter and thinner, and thus the product is more aesthetic. For example, providing a groove in the pixel defining layer, stress concentration can be prevented from occurring in the display substrate during 3D attachment, which may prevent separation and fracture when the display substrate is bent, thereby avoiding encapsulation failure caused by the film layer separation of the encapsulating structure in the display substrate. The decrease in the thickness of the display substrate can effectively prevent air leakage at edges of the product caused by stress concentration at the edges during curved surface attachment. Thus, the performance and market competitiveness of the display substrate are improved.

Described above is an introduction to the display substrate of the present disclosure, and the method for manufacturing the display substrate will be introduced below. The method and principle for manufacturing the display substrate in the embodiments of the present disclosure may be made reference to the following embodiments.

Figure 6:
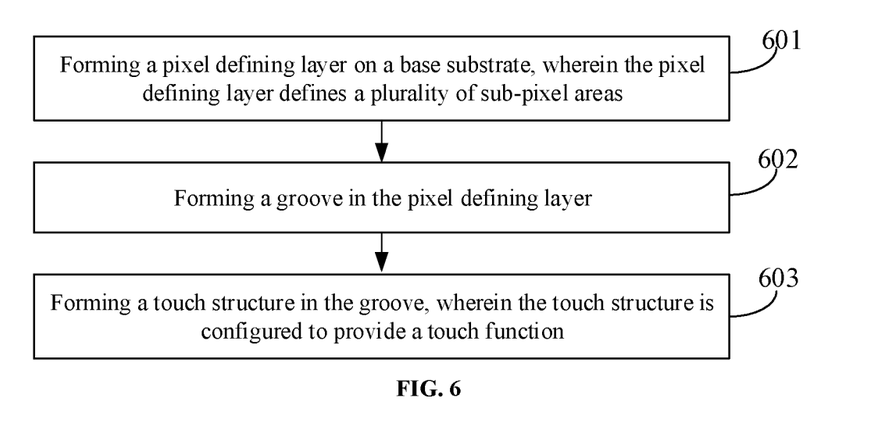
FIG. 6 is a flowchart of a method for manufacturing a display substrate according to an embodiment of the present disclosure.

FIG. 6 is a flowchart of a method for manufacturing a display substrate according to an embodiment of the present disclosure. The method may be applied to manufacture the display substrate according to the foregoing embodiments. As shown in FIG. 6, the method includes following steps.

In step 601, a pixel defining layer is formed on a base substrate. The pixel defining layer defines a plurality of sub-pixel areas.

The base substrate may be a transparent substrate, and may be a rigid substrate made of a light-guiding and non-metallic material such as glass, quartz, or transparent resin that has a certain degree of ruggedness, or the base substrate may be a flexible substrate made of polyimide (PI) or the like.

The material of the pixel defining layer may be a transparent organic material such as organic resin, or may be a transparent inorganic material such as $SiO_x$ (silicon oxide), $SiN_x$ (silicon nitride), $Al_2O_3$ (aluminum oxide), or $SiO_xN_x$ (silicon oxynitride). In an exemplary embodiment, an organic resin material layer may be formed on the base substrate through a plasma enhanced chemical vapor deposition (PECVD) process, and the pixel defining layer is acquired by processing the organic resin material layer through a one-time patterning process.

In step 602, a groove is formed in the pixel defining layer.
Optionally, the groove is formed in the pixel defining layer through the one-time patterning process.

In step 603, a touch structure is formed. The touch structure is disposed in the groove of the pixel defining layer, and the touch structure is configured to provide a touch function.

As shown in FIG. 2 to FIG. 5, the touch structure 300 includes a plurality of emitting electrode groups 300S and a plurality of receiving electrode groups 300R. Each emitting electrode group 300S includes a plurality of emitting electrodes 301S and a first connecting line 302S connecting the plurality of emitting electrodes 301S, and each receiving electrode group 300R includes a plurality of receiving electrodes 301R and a second connecting line 302R connecting the plurality of receiving electrodes 301R. The emitting electrodes 301S and the first connecting line 302S are disposed on the side of the insulating dielectric layer 600 proximate to the base substrate 100, and the receiving electrodes 301R and the second connecting line 302R are disposed on the side of the insulating dielectric layer 600 distal from the base substrate 100.

In an exemplary embodiment, the emitting electrodes 301S and the first connecting line 302S are firstly formed on the side of the pixel defining layer 200 distal from the base substrate 100. The emitting electrodes 301S are connected to the first connecting line 302S, and the emitting electrodes 301S and the first connecting line 302 are disposed in the grooves of the pixel defining layer 200. Then, the insulating dielectric layer 600 is formed on the side of the emitting electrodes 301S and the side of the first connecting line 302S distal from the base substrate 100, such that the insulating dielectric layer 600 is provided in each groove. Afterwards, the receiving electrodes 301R and the second connecting line 302R are formed on the side of the insulating dielectric layer 600 distal from the base substrate 100. The receiving electrode 301R and the emitting electrode 301S are disposed in different grooves, and the first connecting line 302S and the second connecting line 302R intersect.

The emitting electrodes 301S and the first connecting line 302S may be manufactured by a one-time process, and the receiving electrodes 301R and the second connecting line 302R may be manufactured by a one-time process. For example, manufacturing the emitting electrodes 301S and the first connecting line 302S by a one-time process includes: forming a metal material layer on the side of the pixel defining layer 200 distal from the base substrate 100 by any one of magnetron sputtering, thermal evaporation, PECVD or the like, and acquiring the emitting electrodes 301S and the first connecting line 302S by processing the metal material layer through the one-time patterning process. Manufacturing the receiving electrodes 301R and the second connecting line 302R through a one-time process includes: forming a metal material layer on the side of the insulating dielectric layer 600 distal from the base substrate 100 by any one of magnetron sputtering, thermal evaporation, PECVD or the like, and acquiring the receiving electrodes 301R and the second connecting line 302R by processing the metal material layer through the one-time patterning process.

As shown in FIG. 3 to FIG. 5, prior to forming the pixel defining layer 200 on the base substrate 100, the method further includes: sequentially forming a back plate circuit layer, a planarization layer 800, and an anode 4011 on the base substrate 100. The anode 4011 is disposed in the sub-pixel area, and the back plate circuit layer includes a plurality of TFTs 402.

After forming the pixel defining layer 200 on the base substrate 100 and prior to forming the touch structure 300, the method further includes: sequentially forming a light-emitting layer 4012, a cathode 4013, and a first inorganic sub-layer 701 on the side of the pixel defining layer 200 distal from the base substrate 100. The light-emitting layer 4012 is disposed in the sub-pixel area and laminated on the anode 4011. The cathode 4013 covers the sub-pixel area and the pixel defining layer 200, and extends into the groove of the pixel defining layer 200. The first inorganic sub-layer 701 is disposed on the side of the cathode 4013 distal from the base substrate 100 and filled into the groove. The anode 4011, the light-emitting layer 4012, and the cathode 4013 are laminated to form a light-emitting unit 401, and the light-emitting unit 401 and the TFT 402 are electrically connected to form a sub-pixel 400.

After forming the touch structure 300, the method further includes: sequentially forming an organic sub-layer 702 and a second inorganic sub-layer 703 on the side of the touch structure 300 distal from the base substrate 100. The first inorganic sub-layer 701, the organic sub-layer 702, and the second inorganic sub-layer 703 are laminated to form an encapsulating structure 700.

In the present disclosure, the touch structure 300 is disposed between the first inorganic sub-layer 701 and the organic sub-layer 702, which can not only prevent the water and oxygen from affecting the performance of the display substrate, but also reduce the thickness of the display substrate.

Persons skilled in the art may easily understand that the sequence of steps of the method for manufacturing the display substrate according to the embodiments of the present disclosure can be appropriately adjusted, and the steps can also be correspondingly added or deleted according to the situation. Within the technical scope disclosed in the present disclosure, any method that can be easily conceived by persons skilled in the art shall fall within the protection scope of the present disclosure, and details are not repeated herein.

The present disclosure further provides a display device, including the display substrate according to the aforesaid embodiments. Therefore, the display device has all the features and advantages of the aforementioned display substrate, which will not be repeated herein. In general, the display device has a good touch performance, and also has the advantage of a reduced thickness.

In the present disclosure, orientation or position relationships indicated by the terms "upper", "lower", "top", "bottom", etc. are based on the orientation or position relationships as shown in the drawings, which are merely used for the convenience of description, rather than indicate or imply that the indicated device or element must be in a particular orientation or be constructed and operated in a particular orientation. Therefore, these terms should not be understood as a limitation to the present disclosure. In addition, the terms "first", "second" and "third" are merely used for a descriptive purpose, and cannot be understood as indicating or implying a relative importance, or implicitly indicating the number of the indicated technical features. Hence, the features defined by "first", "second" and "third" can explicitly or implicitly include one or more features. The term "a plurality of" means two or more, unless otherwise defined. The term "electrically connected" means a connection with a capacity of transferring charges, but it's not limited that there must be charges transferred. For example, if A and B are electrically connected, it means that A and B are connected, and charges may be transferred between A and B, but it's not limited that there must be charges transferred between A and B. The term "connection" should be understood in a broad sense, e.g., it can be a direct connection (e.g., direct contact) or an indirect connection (e.g., indirect contact through the intermedium). The meanings of the foregoing terms in the present disclosure may be understood by those skilled in the art based on specific circumstances.

In the descriptions of this specification, the descriptions with reference to terms such as "some embodiments", "in an exemplary embodiment", and the like indicate that the features, structures, materials or characteristics described in conjunction with the embodiment or example are included in at least one embodiment or example of the present disclosure. In this specification, the illustrative descriptions of the aforesaid terms do not necessarily for the same embodiment or example. Moreover, the specific features, structures, materials or characteristics as described may be appropriately combined in any one or more embodiments or examples. In addition, under the circumstance of without contradicting each other, those skilled in the art may combine different embodiments or examples, and the features in different embodiments or examples described in this specification.

Although the embodiments of the present disclosure have been shown and described above, it shall be understood that the aforesaid embodiments are exemplary and shall not be understood as a limitation to the present disclosure. Those of ordinary skills in the art may make changes, modifications, replacements and variations to the aforesaid embodiments within the scope of the present disclosure.

What is claimed is:

1. A display substrate, comprising:
   a base substrate;
   a pixel defining layer disposed on the base substrate, wherein the pixel defining layer defines a plurality of sub-pixel areas and has a groove therein; and
   a touch structure disposed in the groove, wherein the touch structure is configured to provide a touch function; wherein
   the touch structure comprises a plurality of touch electrodes, wherein each of the touch electrodes corresponds to at least one sub-pixel area, and an area corresponding to the sub-pixel area of the touch electrode is a light-transmitting area;
   the area corresponding to the sub-pixel area of the touch electrode has an opening;
   an orthographic projection of the touch electrode on the base substrate is in the shape of a ring, and an orthographic projection of the sub-pixel area corresponding to the touch electrode on the base substrate is within the ring.

2. The display substrate according to claim 1, wherein the touch electrode is in the shape of a ring.

3. The display substrate according to claim 1, wherein an inner ring and an outer ring of the ring are both rectangular.

4. The display substrate according to claim 1, wherein
   the touch structure comprises a plurality of emitting electrode groups and a plurality of receiving electrode groups, wherein the plurality of receiving electrode groups is arranged in an array along a first direction, and the plurality of emitting electrode groups is arranged in an array along a second direction, wherein
   the emitting electrode group comprises a plurality of emitting electrodes and a first connecting line connecting the plurality of emitting electrodes, the plurality of emitting electrodes being arranged in an array along the first direction; and
   the receiving electrode group comprises a plurality of receiving electrodes and a second connecting line connecting the plurality of receiving electrodes, the plurality of receiving electrodes being arranged in an array along the second direction, wherein the emitting electrode and the receiving electrode are both touch electrodes; the first connecting line and the second connecting line intersect; and an orthographic projection of the emitting electrode on the base substrate is not overlapped with an orthographic projection of the receiving electrode on the base substrate.

5. The display substrate according to claim 4, wherein the pixel defining layer has a plurality of grooves, and the emitting electrode and the receiving electrode are disposed in different grooves.

6. The display substrate according to claim 4, further comprising:
an insulating dielectric layer, disposed between the first connecting line and the second connecting line.

7. The display substrate according to claim 6, wherein at least a portion of the insulating dielectric layer is disposed in the groove in which the touch electrode is disposed.

8. The display substrate according to claim 1, wherein an opening of the groove is on a side of the pixel defining layer distal from the base substrate.

9. The display substrate according to claim 1, wherein a depth of the groove is greater than or equal to a maximum thickness of the touch structure, wherein the depth is a dimension of the groove in a direction perpendicular to the base substrate, and a thickness of the touch structure is a dimension of the touch structure in the direction perpendicular to the base substrate.

10. The display substrate according to claim 1, wherein an opening of the groove has a width of 15 to 30 µm.

11. The display substrate according to claim 1, further comprising:
a light-emitting unit, disposed in the sub-pixel area; and
an encapsulating structure, disposed on a side of the light-emitting unit distal from the base substrate, wherein the encapsulating structure comprises a first inorganic sub-layer, an organic sub-layer and a second inorganic sub-layer laminated in a direction going away from the base substrate, and the touch structure is disposed between the first inorganic sub-layer and the organic sub-layer.

12. The display substrate according to claim 11, wherein at least a portion of the first inorganic sub-layer is in contact with at least a portion of the organic sub-layer.

13. The display substrate according to claim 1, further comprising:
a back plate circuit layer, disposed between the pixel defining layer and the base substrate.

14. The display substrate according to claim 1, wherein the display substrate is a flexible display substrate.

15. The display substrate according to claim 1, wherein the display substrate is a flexible display substrate; the touch electrode is in the shape of a ring; an inner ring and an outer ring of the ring being both rectangular; the touch structure comprises a plurality of emitting electrode groups and a plurality of receiving electrode groups, the plurality of receiving electrode groups being arranged in an array along a first direction and the plurality of emitting electrode groups being arranged in an array along a second direction, wherein the emitting electrode group comprises a plurality of emitting electrodes and a first connecting line connecting the plurality of emitting electrodes, the plurality of emitting electrodes being arranged in an array along the first direction; and the receiving electrode group comprises a plurality of receiving electrodes and a second connecting line connecting the plurality of receiving electrodes, the plurality of receiving electrodes being arranged in an array along the second direction, wherein the emitting electrode and the receiving electrode are both touch electrodes; the first connecting line and the second connecting line intersect; and the emitting electrode and the receiving electrode are disposed in different grooves, an opening of the groove is on a side of the pixel defining layer distal from the base substrate, a depth of the groove is greater than or equal to a maximum thickness of the touch structure, wherein the depth is a dimension of the groove in a direction perpendicular to the base substrate, and a thickness of the touch structure is a dimension of the touch structure in the direction perpendicular to the base substrate; and the opening of the groove has a width of 15 to 30 µm; the display substrate further comprises:
an insulating dielectric layer, disposed between the first connecting line and the second connecting line, wherein at least a portion of the insulating dielectric layer is disposed in the groove in which the touch electrode is disposed;
a light-emitting unit, disposed in the sub-pixel area;
an encapsulating structure, disposed on a side of the light-emitting unit distal from the base substrate, wherein the encapsulating structure comprises a first inorganic sub-layer, an organic sub-layer and a second inorganic sub-layer laminated in a direction going away from the base substrate, the touch structure is disposed between the first inorganic sub-layer and the organic sub-layer, and at least a portion of the first inorganic sub-layer is in contact with at least a portion of the organic sub-layer; and
a back plate circuit layer, disposed between the pixel defining layer and the base substrate.

16. A method for manufacturing a display substrate, comprising:
forming a pixel defining layer on a base substrate, wherein the pixel defining layer defines a plurality of sub-pixel areas;
forming a groove in the pixel defining layer; and
forming a touch structure in the groove, wherein the touch structure is configured to provide a touch function; wherein
the touch structure comprises a plurality of touch electrodes, wherein each of the touch electrodes corresponds to at least one sub-pixel area, and an area corresponding to the sub-pixel area of the touch electrode is a light-transmitting area;
the area corresponding to the sub-pixel area of the touch electrode has an opening;
an orthographic projection of the touch electrode on the base substrate is in the shape of a ring, and an orthographic projection of the sub-pixel area corresponding to the touch electrode on the base substrate is within the ring.

17. A display device, comprising a display substrate, wherein the display substrate comprises:
a base substrate;
a pixel defining layer disposed on the base substrate, wherein the pixel defining layer defines a plurality of sub-pixel areas and has a groove therein; and
a touch structure disposed in the groove, wherein the touch structure is configured to provide a touch function; wherein the touch structure comprises a plurality of touch electrodes, wherein each of the touch electrodes corresponds to at least one sub-pixel area, and an area corresponding to the sub-pixel area of the touch electrode is a light-transmitting area;
the area corresponding to the sub-pixel area of the touch electrode has an opening;
an orthographic projection of the touch electrode on the base substrate is in the shape of a ring, and an orthographic projection of the sub-pixel area corresponding to the touch electrode on the base substrate is within the ring.

* * * * *